United States Patent
Yamazaki et al.

(10) Patent No.: US 9,660,157 B2
(45) Date of Patent: May 23, 2017

(54) ADDITION-CURABLE SILICONE RESIN COMPOSITION AND DIE ATTACH MATERIAL FOR OPTICAL SEMICONDUCTOR DEVICE

(71) Applicant: Shin-Etsu Chemical Co., Ltd., Tokyo (JP)

(72) Inventors: Tatsuya Yamazaki, Annaka (JP); Tsutomu Kashiwagi, Annaka (JP); Miyuki Wakao, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 15/053,760

(22) Filed: Feb. 25, 2016

(65) Prior Publication Data

US 2016/0251482 A1 Sep. 1, 2016

(30) Foreign Application Priority Data

Feb. 26, 2015 (JP) .................................. 2015-036108

(51) Int. Cl.
*C09J 183/04* (2006.01)
*H01L 33/60* (2010.01)
*C08G 77/12* (2006.01)
*C08G 77/20* (2006.01)

(52) U.S. Cl.
CPC ............ *H01L 33/60* (2013.01); *C09J 183/04* (2013.01); *C08G 77/12* (2013.01); *C08G 77/20* (2013.01)

(58) Field of Classification Search
None
See application file for complete search history.

(56) References Cited

U.S. PATENT DOCUMENTS

| | | | | |
|---|---|---|---|---|
| 4,322,518 A * | 3/1982 | Blizzard | ................ | C08G 77/12 427/387 |
| 4,707,531 A * | 11/1987 | Shirahata | ............... | C08G 77/06 528/12 |
| 5,338,817 A * | 8/1994 | Mine | ...................... | C08G 77/12 528/12 |
| 5,527,873 A * | 6/1996 | Kobayashi | ............. | C08G 77/12 525/478 |
| 8,859,693 B2 | 10/2014 | Hasegawa et al. | | |
| 9,045,637 B2 | 6/2015 | Meguriya et al. | | |
| 2006/0275617 A1 * | 12/2006 | Miyoshi | .................. | C08L 83/04 428/448 |
| 2007/0106016 A1 | 5/2007 | Zhu | | |
| 2009/0258216 A1 | 10/2009 | Yamakawa et al. | | |

FOREIGN PATENT DOCUMENTS

| | | |
|---|---|---|
| JP | 2008-255227 A | 10/2008 |
| JP | 2010-174234 A | 8/2010 |
| WO | WO 2013/047898 A1 | 4/2013 |
| WO | WO 2014/104080 A1 | 7/2014 |

OTHER PUBLICATIONS

Extended European Search Report issued Jul. 1, 2016, in European Patent Application No. 16155442.3.

* cited by examiner

*Primary Examiner* — Robert S Loewe
(74) *Attorney, Agent, or Firm* — Birch, Stewart, Kolasch & Birch, LLP

(57) ABSTRACT

An addition-curable silicone resin composition includes (A-1) a linear organopolysiloxane having at least two alkenyl groups per molecule, (A-2) a terminal alkenyl group-containing branched organopolysiloxane having at least two alkenyl groups per molecule, (B) an organohydrogenpolysiloxane with a content of low-molecular-weight siloxane having a degree of polymerization of up to 10 and one or more terminal SiH group per molecule of 5 wt % or less, and (C) an addition reaction catalyst. The composition can be cured to form a product which, when used as a die attach material for optical semiconductor devices, minimizes contamination of the gold electrode pads on LED chips and imparts a good wire bondability.

8 Claims, No Drawings

ADDITION-CURABLE SILICONE RESIN COMPOSITION AND DIE ATTACH MATERIAL FOR OPTICAL SEMICONDUCTOR DEVICE

CROSS-REFERENCE TO RELATED APPLICATION

This non-provisional application claims priority under 35 U.S.C. S119(a) on Patent Application No. 2015-036108 filed in Japan on Feb. 26, 2015, the entire contents of which are hereby incorporated by reference.

TECHNICAL FIELD

This invention relates to an addition-curable silicone resin composition and a die attach material for optical semiconductor devices that is made of such a composition.

BACKGROUND ART

Light-emitting diodes (LEDs), owing to their low power consumption and longevity compared with conventional luminescent devices such as light bulbs and fluorescent lamps, have seen a rapid growth in use in recent years. The fabrication of optical semiconductor devices includes the steps of applying, to specific positions on a substrate, a curable resin composition called a die attach material for attaching LED chips to the substrate, placing LED chips on top of the applied resin composition, and subsequently curing the resin composition. A wire bonding step is then carried out whereby electrode pads on the LED chip that are usually formed of gold are bonded to electrically conductive sites on the substrate with gold wire. The wire bonding step presses a gold ball that forms at a capillary tip against an electrode pad, while at the same time applying ultrasound. However, if the LED chip is not fully attached to the substrate, the ultrasonic waves disperse to the surroundings during pressing, as a result of which the gold wire cannot bond. A curable resin composition that provides a high-strength cured product could be used as the die attach material in order to fully attach the LED chips to the substrate.

By virtue of their heat resistance and light resistance, addition-curable silicone resin compositions such as methyl silicone systems are commonly used in die attach materials. However, it has been reported that, due to various factors such as the types of addition-curable silicone resin composition and LED chip used and the resin composition curing conditions, contaminants form on the gold electrode pads of the LED chip during cure of the resin composition. When contaminants are present on the electrode pads, this adversely affects the subsequent wire bonding step. Such contaminants are attributed to low-molecular-weight siloxanes present within the addition-curable silicone resin composition. In particular, with the application of heat during the cure, low-molecular-weight siloxanes having silicon atom-bonded hydrogen atoms (SiH groups) thereon vaporize, forming a film on the electrode pads due to hydrolysis reactions and the like, or they gel and deposit as contaminants on the pads. It is known to be possible, by lowering the content of SiH group-containing low-molecular-weight siloxane within the resin composition, to decrease the amount of contaminant that deposits on the LED chip electrode pads during heat-curing and thus improve wire bondability.

For example, JP-A 2008-255227 discloses an addition-curable silicone resin composition which, in addition to non-functional low-molecular-weight siloxanes (e.g., D3, D4), includes also a large amount of low-molecular-weight siloxane containing reactive SiH groups. This publication teaches in particular that, by setting the amount of low-molecular-weight siloxane compounds having a degree of polymerization of 10 or below and containing at least one SiH group on the molecule to not more than a given weight percent of the overall silicone resin composition, contaminant deposition to the surroundings during heat curing can be suppressed. Moreover, the examples described therein mention the removal, at reduced pressure and under nitrogen bubbling, of SiH group-containing low-molecular-weight siloxanes from the organohydrogenpolysiloxane serving as an ingredient of the addition-curable silicone resin composition, followed by the use of a thin-film distillation unit. However, this series of operations takes a great deal of time. Nor is any mention made of, for example, the resin yield following use of a thin-film distillation unit. Hence, for reasons of cost and convenience, further improvements have been desired.

JP-A 2010-174234 reports that addition-curable silicone resin compositions in which an MQ resin having alkenyl groups on the M units serves as an essential ingredient, because they contain no silicon atom-bonded aryl groups such as phenyl groups as substituents on the various constituent organopolysiloxanes, provide cured silicone products that are flexible and retain a good transparency even at elevated temperatures. However, when these addition-curable silicone resin compositions are used in applications requiring a high resin strength, such as die attach materials for optical semiconductor devices, the strength of the resulting cured silicone product leaves something to be desired.

Hence, when conventional addition-curable silicone resin compositions are used as die attach materials for optical semiconductor devices, contaminants deposit on the electrode pads of the LED chips, resulting in a decrease in wire-bondability.

CITATION LIST

Patent Document 1: JP-A 2008-255227
Patent Document 2: JP-A 2010-174234

DISCLOSURE OF INVENTION

It is therefore an object of this invention to provide an addition-curable silicone resin composition which, when used as a die attach material for optical semiconductor devices, minimizes contamination of the gold electrode pads on LED chips and is capable of forming a cured product that imparts good wire bondability. A further object of the invention is to provide a die attach material for optical semiconductor devices that is composed of this composition.

The inventors have found that when an addition-curable silicone resin composition containing components A to C below and using an organohydrogenpolysiloxane that has a low-molecular-weight siloxane content no higher than a specific level and consists essentially of specific constituent units of formula (2) below is employed as a die attach material for optical semiconductor devices, contamination of the electrode pads on LED chips is minimized and an excellent wire bondability is achieved.

Accordingly, in one aspect, the invention provides an addition-curable silicone resin composition which includes:

(A-1) a linear organopolysiloxane having at least two alkenyl groups per molecule;
(A-2) a branched organopolysiloxane of the average compositional formula (1) below which has at least two alkenyl groups per molecule $$R^1{}_{3-t}R^2{}_tSiO_{1/2})_p(R^3{}_2SiO_{2/2})_q(R^3SiO_{3/2})_r(SiO_{4/2})_s \qquad (1)$$

wherein $R^1$ is independently an alkenyl group of 2 to 8 carbon atoms,
$R^2$ is independently a substituted or unsubstituted monovalent hydrocarbon group of 1 to 12 carbon atoms which contains no aliphatic unsaturated bonds,
each $R^3$ is independently $R^1$, or $R^2$, with at least two of the $R^3$ groups on the molecule being $R^1$,
p, q, r and s satisfy the conditions $0.01 \leq p \leq 0.6$, $0 \leq q$, $0 \leq r$ and $0.1 \leq s \leq 0.9$, with the proviso that p+q+r+s=1, and t satisfies the condition $0 \leq t < 3$;
(B) an organohydrogenpolysiloxane of the average compositional formula (2) below which has a content of low-molecular-weight siloxane having a degree of polymerization of up to 10 and at least one SiH group per molecule of 5 wt % or less $$R^4{}_3SiO_{1/2})_a(R^5{}_2SiO_{2/2})_b(R^5SiO_{3/2})_c(SiO_{4/2})_d \qquad (2)$$

wherein each $R^4$ is independently a hydrogen atom or a methyl group, with at least two of all the $R^4$ groups being hydrogen atoms,
each $R^5$ is independently a substituted or unsubstituted monovalent hydrocarbon group of 1 to 12 carbon atoms which contains no aliphatic unsaturated bonds, and
a, b, c and d satisfy the conditions $0.01 \leq a \leq 0.6$, $0 \leq b$, $0 \leq c$ and $0.1 \leq d \leq 0.9$, with the proviso that a+b+c+d=1; and
(C) an addition reaction catalyst.
The content of low-molecular-weight siloxane having a degree of polymerization of up to 10 and at least one SiH group per molecule is preferably 1 wt % or less.
The organohydrogenpolysiloxane serving as component B has a weight-average molecular weight of preferably at least 1,500 and up to 6,000. The viscosity of the organohydrogenpolysiloxane at 25° C., as measured by the method described in JIS K 7117-1: 1999, is preferably at least 10 Pa·s.
Component B is preferably an organohydrogenpolysiloxane of the average compositional formula (3) below $$R^4{}_3SiO_{1/2})_e(SiO_{4/2})_f \qquad (3)$$

wherein each $R^4$ is independently a hydrogen atom or a methyl group, with at least two of all the $R^4$ groups being hydrogen atoms, and
e and f satisfy the conditions $0.01 \leq e \leq 0.6$ and $0.4 \leq f \leq 0.99$, with the proviso that e+f=1.
The source of the $SiO_{4/2}$ units in the organohydrogenpolysiloxane serving as component B is preferably tetraethoxysilane and/or a partial hydrolyzate/condensate of tetraethoxysilane.
Preferably, component A-1 is a linear organopolysiloxane having alkenyl groups only at both ends and component A-2 is a branched organopolysiloxane having, in formula (1), alkenyl groups only on the $R^1{}_{3-t}R^2{}_tSiO_{1/2}$ units.
Preferably, component A-2 is a branched organopolysiloxane of the average compositional formula (4) below $$R^6{}_3SiO_{1/2})_u(R^7{}_3SiO_{1/2})_v(SiO_{4/2})_w \qquad (4)$$

wherein $R^6$ is a vinyl group, $R^7$ is a methyl group, and u, v and w satisfy the conditions $0.01 \leq u+v \leq 0.6$ and $0.4 \leq w \leq 0.99$, with the proviso that u+v+w=1, and has at least two alkenyl groups per molecule.

In another aspect, the invention provides a die attach material for an optical semiconductor device, which material is formed of the foregoing addition-curable silicone resin composition.

Advantageous Effects of the Invention

By including the organohydrogenpolysiloxane specified above, the addition-curable silicone resin composition of the invention, when employed as a die attach material for optical semiconductor devices, is able to minimize contamination of the LED chip electrode pads and confer a good wire bondability. Hence, this addition-curable silicone resin composition is highly useful as a die attach material for optical semiconductor devices.

One conceivable reason for the appearance of such effects is that when the above-specified organohydrogenpolysiloxane is included, the cured form of the resulting addition-curable silicone resin composition has a lower content of SiH-containing volatile low-molecular-weight siloxane than when the organohydrogenpolysiloxanes included in conventional addition-durable silicone resin compositions are used.

DETAILED DESCRIPTION OF THE INVENTION

The objects, features and advantages of the invention will become more apparent from the following detailed description.
The addition-curable silicone resin composition of the invention includes:
(A-1) a linear organopolysiloxane having at least two alkenyl groups per molecule;
(A-2) a branched organopolysiloxane of the average compositional formula (1) below which has at least two alkenyl groups per molecule $$R^1{}_{3-t}R^2{}_tSiO_{1/2})_p(R^3{}_2SiO_{2/2})_q(R^3SiO_{3/2})_r(SiO_{4/2})_s \qquad (1)$$

wherein $R^1$ is independently an alkenyl group of 2 to 8 carbon atoms,
$R^2$ is independently a substituted or unsubstituted monovalent hydrocarbon group of 1 to 12 carbon atoms which contains no aliphatic unsaturated bonds,
each $R^3$ is independently $R^1$ or $R^2$, with at least two of the $R^3$ groups on the molecule being $R^1$,
p, q, r and s satisfy the conditions $0.01 \leq p \leq 0.6$, $0 \leq q$, $0 \leq r$ and $0.1 \leq s \leq 0.9$, with the proviso that p+q+r+s=1, and t satisfies the condition $0 \leq t < 3$;
(B) an organohydrogenpolysiloxane of the average compositional formula (2) below which has a content of a low-molecular-weight siloxane having a degree of polymerization of up to 10 and at least one SiH group per molecule of 5 wt % or less $$R^4{}_3SiO_{1/2})_a(R^5{}_2SiO_{2/2})_b(R^5SiO_{3/2})_c(SiO_{4/2})_d \qquad (2)$$

wherein each $R^4$ is independently a hydrogen atom or a methyl group, with at least two of all the $R^4$ groups being hydrogen atoms,
each $R^5$ is independently a substituted or unsubstituted monovalent hydrocarbon group of 1 to 12 carbon atoms which contains no aliphatic unsaturated bonds, and
a, b, c and d satisfy the conditions $0.01 \leq a \leq 0.6$, $0 \leq b$, $0 \leq c$ and $0.1 \leq d \leq 0.9$, with the proviso that a+b+c+d=1; and
(C) an addition reaction catalyst.
The components of the addition-curable silicone resin composition are each described below in detail.
(A-1) Linear Organopolysiloxane Component A-1 is a linear organopolysiloxane having at least two alkenyl groups per molecule. A linear organopolysiloxane in which the alkenyl groups bonded to silicon atoms are present only at both ends of the molecular chain is preferred, with one having general formula (5) below being especially preferred.

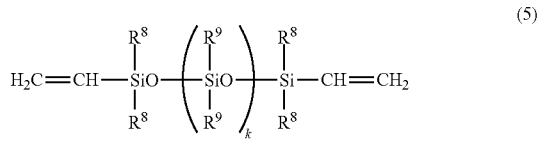

In the formula, $R^8$ is independently an alkenyl group of 2 to 8 carbon atoms or a substituted or unsubstituted monovalent hydrocarbon group of 1 to 12 carbon atoms which contains no aliphatic unsaturated bonds, $R^9$ is independently a substituted or unsubstituted monovalent hydrocarbon group of 1 to 12 carbon atoms which contains no aliphatic unsaturated bonds, and k is 0 or a positive integer, this being a number such that the linear organopolysiloxane has a viscosity at 25° C. of from 10 to 1,000,000 mPa·s.

In formula (5), illustrative examples of the alkenyl group of 2 to 8 carbon atoms, especially 2 to 6 carbon atoms, that may serve as $R^8$ include vinyl, allyl, isopropenyl, butenyl, pentenyl, hexenyl and cyclohexenyl groups. Illustrative examples of the substituted or unsubstituted monovalent hydrocarbon group of 1 to 12 carbon atoms, especially 1 to 10 carbon atoms, which contains no aliphatic unsaturated bonds that may serve as $R^8$ include alkyl groups such as methyl, ethyl, propyl, isopropyl, butyl, isobutyl, tert-butyl, pentyl, neopentyl, hexyl, cyclohexyl, octyl, nonyl and decyl groups; aryl groups such as phenyl, tolyl, xylyl and naphthyl groups; aralkyl groups such as benzyl, phenylethyl and phenylpropyl groups; and any of these groups in which some or all of the hydrogen atoms are substituted with halogen atoms such as fluorine, bromine or chlorine, or with cyano groups, including halogenated alkyl groups such as chloromethyl, chloropropyl, bromoethyl and trifluoropropyl groups, and a cyanoethyl group. The alkenyl group that serves as $R^8$ is preferably a vinyl group. Taking in consideration the discoloration resistance when cured silicone produced from the resulting addition-curable silicone resin composition is left to stand for a long time under high-temperature conditions or in blue light at a wavelength of 450 nm, the substituted or unsubstituted monovalent hydrocarbon group which contains no aliphatic unsaturated bonds that serves as $R^8$ is preferably an alkyl group such as methyl, ethyl, propyl or isopropyl groups, and more preferably a methyl group.

The substituted or unsubstituted monovalent hydrocarbon group of 1 to 12 carbon atoms, especially 1 to 10 carbon atoms, which contains no aliphatic unsaturated bonds that serves as $R^9$ is exemplified by the same groups as those mentioned above as examples of the substituted or unsubstituted monovalent hydrocarbon group which contains no aliphatic unsaturated bonds that serves as $R^8$. Of these, a methyl group is more preferred for the same reason as above.

Compared with organopolysiloxane having pendent alkenyl groups, the linear organopolysiloxane of formula (5) with alkenyl groups only at both ends has an excellent reactivity with SiH group-containing organohydrogenpolysiloxanes, regardless of whether low-molecular-weight siloxane is present. Hence, vaporization of SiH-containing low-molecular-weight siloxane to the surroundings and contaminant formation during cure can be minimized.

The linear organopolysiloxane serving as component A-1 has a viscosity at 25° C. that is preferably in the range of 10 to 1,000,000 mPa·s, and more preferably in the range of 100 to 100,000 mPa·s. When the viscosity at 25° C. is lower than this range, the strength of the cured product obtained from the addition-curable silicone resin composition may decrease. On the other hand, when the viscosity at 25° C. is higher than this range, the workability may decrease. When component A-1 is a mixture of two or more linear organopolysiloxanes, the mixture has a viscosity at 25° C. which is preferably in the range of 10 to 1,000,000 mPa·s. The viscosity of this component is a value measured at 25° C. with a rotary viscometer by the method described in JIS K 7117-1: 1999.

Component A-1 is exemplified by the following linear organopolysiloxanes:

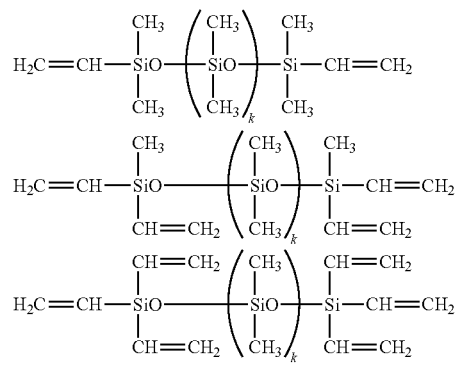

Here, k is the same as defined above.

(A-2) Branched Organopolysiloxane

Component A-2 is a branched organopolysiloxane of the average compositional formula (1) below which has at least 2, and preferably from 5 to 50, alkenyl groups per molecule.

$$R^1{}_{3-t}R^2{}_tSiO_{1/2})_p(R^3{}_2SiO_{2/2})_q(R^3SiO_{3/2})_r(SiO_{4/2})_s \quad (1)$$

In the formula, $R^1$ is independently an alkenyl group of 2 to 8 carbon atoms, $R^2$ is independently a substituted or unsubstituted monovalent hydrocarbon group of 1 to 12 carbon atoms which contains no aliphatic unsaturated bonds, and each $R^3$ is independently $R^1$ or $R^2$, with at least two $R^3$ groups on the molecule being $R^1$. The letters p, q, r and s satisfy the conditions $0.01 \leq p \leq 0.6$, $0 \leq q$, $0 \leq r$ and $0.1 \leq s \leq 0.9$, with the proviso that $p+q+r+s=1$. The letter t satisfies the condition $0 \leq t < 3$, and preferably $1 \leq t < 3$.

In formula (1), illustrative examples of the alkenyl group of 2 to 8 carbon atoms, especially 2 to 6 carbons atoms, which serves as $R^1$ include vinyl, allyl, isopropenyl, butenyl, pentenyl, hexenyl and cyclohexenyl groups, with vinyl and allyl groups being preferred, and a vinyl group being especially preferred.

Illustrative examples of the substituted or unsubstituted monovalent hydrocarbon group of 1 to 12 carbon atoms, especially 1 to 10 carbons atoms, which contains no aliphatic unsaturated bonds that serve as $R^2$ include alkyl groups such as methyl, ethyl, propyl, isopropyl, butyl, isobutyl, text-butyl, pentyl, neopentyl, hexyl, cyclohexyl, octyl, nonyl and decyl groups; aryl groups such as phenyl, tolyl, xylyl and naphthyl groups; aralkyl groups such as benzyl, phenylethyl and phenylpropyl groups; and any of these groups in which some or all of the hydrogen atoms are substituted with halogen atoms such as fluorine, bromine or chlorine, or with cyano groups, including halogenated alkyl groups such as chloromethyl, chloropropyl, bromoethyl and trifluoropropyl groups, and a cyanoethyl group. Taking in consideration the discoloration resistance when cured silicone produced from the resulting addition-curable silicone resin composition is left to stand for a long time under high-temperature conditions or in blue light at a wavelength of 450 nm, alkyl groups such as methyl, ethyl, propyl or isopropyl groups are preferred, and methyl groups are especially preferred.

$R^3$ is $R^1$ or $R^2$, and is exemplified by the same groups as mentioned above for $R^1$ and $R^2$. $R^3$ is a substituent on D units (the structural units indicated in the above formula as $R^3{}_2SiO_{2/2}$) and on T units (the structural units indicated in the above formula as $R^3SiO_{3/2}$). When $R^3$ is an alkenyl group, the reactivity is inferior to that of alkenyl groups present in M units (the structural units indicated in the above formula as $R^1{}_{3-t}R^2{}_tSiO_{1/2}$). Hence, SiH group-containing low-molecular-weight siloxanes are not readily consumed within the system during cure, and tend to vaporize to the surroundings. It is thus preferable for alkenyl groups to be present only on the M units. Hence, it is preferable for component A-2 to include alkenyl groups only on the M units and to include no alkenyl groups on the D and T units; that is, $R^3$ is preferably $R^2$. Accordingly, taking in consideration the discoloration resistance of the cured silicone produced from the resulting addition-curable silicone resin composition, $R^3$, as with $R^2$ above, is more preferably an alkyl group such as a methyl, ethyl, propyl or isopropyl group, and is most preferably a methyl group.

Thus, a branched organopolysiloxane having alkenyl groups only on M units, compared with organopolysiloxanes having alkenyl groups on D units or T units has an excellent reactivity with SiH group-containing organohydrogenpolysiloxanes, regardless of whether low-molecular-weight siloxane is present. Hence, vaporization of SiH group-containing low-molecular-weight siloxanes to the surroundings and contaminant formation during cure can be minimized.

The content p of $R^1{}_{3-t}R^2{}_tSiO_{1/2}$ units within formula (1), relative to the sum p+q+r+s=1 of siloxane units, is in the range of 0.01≤p≤0.6, and preferably 0.1≤p≤0.4. The content q of $R^3{}_2SiO_{2/2}$ units, relative to the sum p+q+r+s=1 of siloxane units, is 0≤q, and preferably in the range of 0≤q≤0.4. The content r of $R^3SiO_{3/2}$ units, relative to the sum p+q+r+s=1 of siloxane units, is 0≤r, and preferably in the range of 0≤r≤0.4. The content s of $SiO_{4/2}$ units, relative to the sum p+q+r+s=1 of siloxane units, is in the range of 0.1≤s≤0.9, and preferably 0.3≤s≤0.6.

As noted above, component A-2 is a branched organopolysiloxane having at least two alkenyl groups per molecule, wherein the constituent units are units selected from among the above $R^1{}_{3-t}R^2{}_tSiO_{1/2}$ units, $R^3{}_2SiO_{2/2}$ units, $R^3SiO_{3/2}$ units and $SiO_{4/2}$ units. The constituent units preferably consist essentially of $R^1{}_{3-t}R^2{}_tSiO_{1/2}$ units, $R^3SiO_{3/2}$ units and $SiO_{4/2}$ units, and more preferably consist essentially of $R^1{}_{3-t}R^2{}_tSiO_{1/2}$ units and $SiO_{4/2}$ units. With such constituent units, the addition curing reaction proceeds easily, increasing the strength of the resulting cured silicone product.

The organopolysiloxane serving as component A-2 is preferably a branched organopolysiloxane of the average compositional formula (4) below having at least two alkenyl groups per molecule.

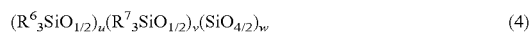

(4)

In the formula, $R^6$ is a vinyl group and $R^7$ is a methyl group. Also, the letters u, v and w satisfy the conditions 0.01≤u+v≤0.6 and 0.4≤w≤0.99, and preferably satisfy the conditions 0.05≤u≤0.2, 0.2≤v≤0.35, 0.1≤u+v≤0.4, and 0.6≤w≤0.9, with the proviso that u+v+w=1.

The organopolysiloxane of formula (4), by having alkenyl groups only on the M units, is highly reactive and can increase the crosslink density during reaction, enabling a cured silicone product of high hardness to be obtained.

Component (A-2) can easily be synthesized by mixing together compounds that serve as sources for the respective units in ratios within the above content ranges and carrying out, for example, co-hydrolysis/condensation in the presence of oxygen.

Here, exemplary sources of the $R^1{}_{3-t}R^2{}_tSiO_{1/2}$ units include, but are not limited to, organosilicon compounds such as triorganochlorosilanes, triorganoalkoxysilanes and hexaorganodisiloxanes of the structural formulas shown below. In these formulas, "Me" represents a methyl group and "Et" represents an ethyl group.

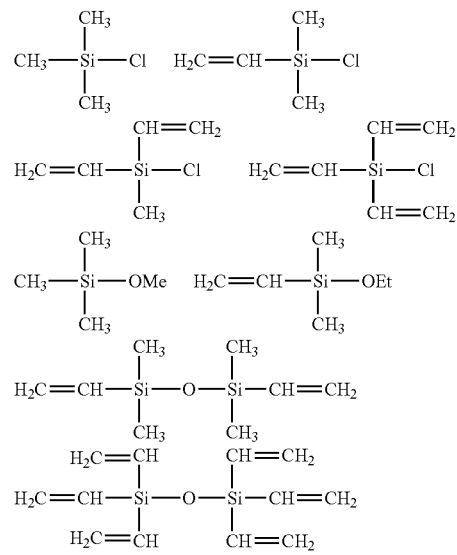

Exemplary sources of the $R^3{}_2SiO_{2/2}$ units include, but are not limited to, diorganodichlorosilanes and diorganodialkoxysilanes.

Exemplary sources of the $R^3SiO_{3/2}$ units include, but are not limited to, organotrichlorosilanes and organotrialkoxysilanes.

Exemplary sources of the $SiO_{4/2}$ units include, but are not limited to, carbon tetrachloride, tetraalkoxysilanes and polyalkylsilicates.

The compounding ratio of components A-1 and A-2, expressed as the weight ratio A-1:A-2, is preferably from 20:80 to 80:20, and more preferably from 30:70 to 70:30. When the weight ratio for component A-1 is too large, the strength of the resulting cured silicone product may decrease. On the other hand, when the weight ratio for component A-1 is too small, the viscosity of the silicone resin composition may become too high, lowering the workability.

(B) Organohydrogenpolysiloxane

Component B is an organohydrogenpolysiloxane of the average compositional formula (2) below, wherein the content of low-molecular-weight siloxane having a degree of polymerization of up to 10 and at least one SiH group per molecule is 5 wt or less, and especially 2.5 wt % or less.

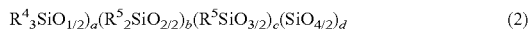  (2)

In the formula, $R^4$ is independently a hydrogen atom or a methyl group, with at least two of all the $R^4$ groups being hydrogen atoms. Each $R^5$ is independently a substituted or unsubstituted monovalent hydrocarbon group of 1 to 12 carbon atoms which contains no aliphatic unsaturated bonds. Also, the letters a, b, c and d satisfy the conditions $0.01 \leq a \leq 0.6$, $0 \leq b$, $0 \leq c$ and $0.1 \leq d \leq 0.9$, with the proviso that $a+b+c+d=1$.

In formula (2), the substituted or unsubstituted monovalent hydrocarbon group of 1 to 12 carbon atoms, especially 1 to 10 carbon atoms, which contains no aliphatic unsaturated bonds is exemplified by the same groups as mentioned above for $R^2$. Specifically, alkyl groups such as methyl, ethyl, propyl and isopropyl groups are preferred, with a methyl group being especially preferred.

Also, the letters a, b, c and d satisfy the conditions $0.01 \leq a \leq 0.6$, $0 \leq b$, $0 \leq c$ and $0.1 \leq d \leq 0.9$, and preferably satisfy the conditions $0.01 \leq a \leq 0.5$, $0 \leq b \leq 0.4$, $0 \leq c \leq 0.4$ and $0.5 \leq d \leq 0.9$, with the proviso that $a+b+c+d=1$.

Component B acts as a crosslinking agent. The addition-curable silicone resin composition of the invention forms into a cured silicone product by an addition reaction between alkenyl groups (most preferably vinyl groups) bonded to silicon atoms in components A-1 and A-2, and hydrogen atoms bonded to silicon atoms (SiH groups) in component B.

In component B, the content of low-molecular-weight siloxane having a degree of polymerization of up to 10 and at least one SiH group per molecule is 5 wt % or less, preferably 2.5 wt % or less, and more preferably 1 wt % or less. At a SiH group-containing low-molecular-weight siloxane content at or below this value, the vaporization of SiH group-containing low-molecular-weight siloxane and consequent formation of deposits on the surroundings during the cure can be minimized. The content of SiH group-containing low-molecular weight siloxane may even be 0 wt %.

As used herein, "low-molecular-weight siloxane content" refers to the content of low-molecular-weight siloxane measured by gas chromatography under the following conditions.

Measurement Conditions:
  Apparatus: GC-2014 (Shimadzu Corporation)
  Column: HP-5MS (Agilent Technologies; 0.25 mm I.D.× 30 m; packing, 5% phenyl methylpolysiloxane)
  Detector: Flame ionization detector
    (detector temperature, 300° C.)
  Sample: Samples were prepared by dissolving 1.0 g of specimen in 10 mL of n-tetradecane/acetone standard solution (concentration, 20 μg/mL)
  Injected amount: 1 μL
  Oven temperature: 50° C. to 280° over 23 minutes, then 280° C. for 17 minutes
  Carrier gas: Helium at linear velocity of 34.0 cm/s Component B has reactive S1H groups only on the M units (those structural units indicated in the above formula as $R^4_3SiO_{1/2}$), which have a good reactivity. Hence, compared with cases in which organohydrogenpolysiloxanes having SiH groups on D units (the structural units indicated in the above formula as $R^5_2SiO_{2/2}$) or T units (the structural units indicated in the above formulas as $R^5SiO_{3/2}$) are used, component B, including SiH group-containing low-molecular-weight siloxane therein, is rapidly consumed within the system during the cure. This makes it possible to reduce the deposition of contaminants on the surroundings.

The organohydrogenpolysiloxane serving as component B has a weight-average molecular weight that is preferably at least 1,500 and not more than 6,000, and more preferably at least 2,500 and not more than 5,000. At a weight-average molecular weight in this range, the organohydrogenpolysiloxane itself has a low volatility, enabling contaminant deposition on the surroundings during cure to be minimized. At a weight-average molecular weight lower than this range, the degree of contaminant deposition may increase, whereas at a weight-average molecular weight higher than this range, the workability may decrease.

As used herein, "weight-average molecular weight" refers to the weight-average molecular weight as measured by gel permeation chromatography (GPC) under the following conditions against a polystyrene standard.
  Developing solvent: Tetrahydrofuran (THF)
  Flow rate: 0.6 mL/min
  Detector: Differential refractive index detector (RI)
  Columns: TSK Guard Column Super H-L
    TSK gel Super H4000 (6.0 mm I.D.×15 cm×1)
    TSK gel Super H3000 (6.0 mm I.D.×15 cm×1)
    TSK gel Super H2000 (6.0 mm I.D.×15 cm×2)
    (all products of Tosoh Corporation)
  Column temperature: 40° C.
  Amount of sample injected: 20 μL (0.5 wt % THF solution)

The organohydrogenpolysiloxane serving as component (B) has a viscosity at 25° C., as measured by the method described in JIS K 7117-1: 1999, of preferably at least 10 Pa's, and more preferably at least 200 Pa's. The polysiloxane may take the form of a liquid, semisolid or solid, although a semisolid or solid form is especially preferred. When component B satisfies these conditions of viscosity and form, the organohydrogenpolysiloxane itself has a low volatility, enabling contaminant deposition to the surroundings at the time of curing to be minimized.

In the practice of the invention, "semisolid substance" refers to a solid substance having a flowability that allows the viscosity at 25° C. to be measured with a rotary viscometer, and refers in particular to a substance having a viscosity at 25° C. of at least 100 Pas and not more than 10,000 Pa·s.

In addition, the organohydrogenpolysiloxane of component B has preferably at least 2 SiH groups, and more preferably from 5 to 50 SiH groups, per molecule, with the amount of SiH groups on the organohydrogenpolysiloxane being preferably from 0.1 to 2 mol/100 g, and more preferably from 0.2 to 0.9 mol/100 g.

The organohydrogenpolysiloxane serving as component B preferably has the following average compositional formula (3).

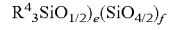  (3)

In the formula, $R^4$ is independently a hydrogen atom or a methyl group, with at least two of all the $R^4$ groups being hydrogen atoms. The letters e and f satisfy the conditions $0.01 \leq e \leq 0.6$ and $0.4 \leq f \leq 0.99$, and preferably satisfy the conditions $0.01 \leq e \leq 0.5$ and $0.5 \leq f \leq 0.9$, with the proviso that $e+f=1$.

Because the organohydrogenpolysiloxane of formula (3) includes, as the essential siloxane units, M units having hydrogen atoms bonded to silicon atoms (in the structural units indicated as $R^4_3SiO_{1/2}$ in the above formula, those structural units wherein at least one $R^4$ is a hydrogen atom) and Q units (structural units indicated as $SiO_{4/2}$ in the above formula), the cured silicone product obtained from an addition-curable silicone resin composition which includes this organohydrogenpolysiloxane minimizes contaminant deposition to the surroundings during the cure and has a high strength.

The content e of $R^4{}_3SiO_{1/2}$ units (M units) within the organohydrogenpolysiloxane of formula (3), relative to the sum e+f=1 of siloxane units making up the organohydrogenpolysiloxane of formula (3), is in the range of $0.01 \leq e \leq 0.6$, and preferably $0.1 \leq e \leq 0.5$. At a content e of M units lower than this range, the weight-average molecular weight is larger, which may lead to a decrease in workability. On the other hand, at a content e higher than this range, the weight-average molecular weight is smaller, which may lead to vaporization of component B and increased contamination during the cure.

Component B, as with component A-2 above, can easily be synthesized by mixing together compounds which serve as sources for the respective units in ratios within the above content ranges and carrying out, for example, co-hydrolysis/condensation in the presence of oxygen.

Here, exemplary sources of the $R^4{}_3SiO_{1/2}$ units include, but are not limited to, organosilicon compounds such as triorganochlorosilanes, triorganoalkoxysilanes and hexaorganodisiloxanes of the structural formulas shown below. In these formulas, "Me" represents a methyl group and "Et" represents an ethyl group.

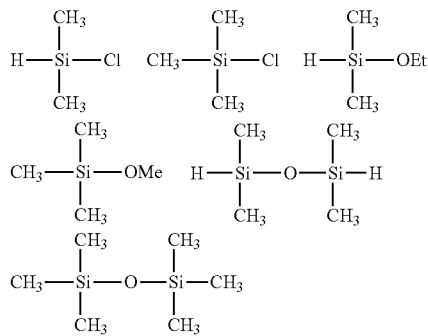

Exemplary sources of the $R^5{}_2SiO_{2/2}$ units include, but are not limited to, diorganodichlorosilanes and diorganodialkoxysilanes.

Exemplary sources of the $R^5SiO_{3/2}$ units include, but are not limited to, organotrichlorosilanes and organotrialkoxysilanes.

Exemplary sources of the $SiO_{4/2}$ units include, but are not limited to, carbon tetrachloride and tetraalkoxysilanes, with tetramethoxysilane and/or partial hydrolyzate/condensates of tetraethoxysilane of the following structural formula being especially preferred. In the formulas below, "Me" represents a methyl group and "Et" represents an ethyl group.

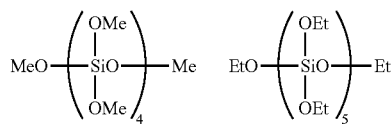

By using tetramethoxysilane and/or a partial hydrolyzate/condensate of tetraethoxysilane as the source of $SiO_{4/2}$ units, an organohydrogenpolysiloxane having a large weight-average molecular weight can be obtained and the content of volatile SiH group-containing low-molecular-weight siloxane is low. As a result, the organohydrogenpolysiloxane can be used directly as is following synthesis, without carrying out low-molecular-weight siloxane removal operations entailing prolonged vacuum distillation under nitrogen bubbling or the use of a thin-film distillation system.

When tetramethoxysilane and/or a partial hydrolyzate/condensate of tetraethoxysilane are used as the source of $SiO_{4/2}$ units, it is preferable for the content of monomers such as tetramethoxysilane within the partial hydrolyzate/condensate to be low. The monomer content is preferably not more than 10 wt %, and more preferably not more than 5 wt %. When the monomer content in the hydrolyzate/condensate is high, a large amount of volatile SiH group-containing low-molecular-weight siloxane is present within component B, increasing the likelihood of contamination of the surroundings during the cure.

The amount of component B included in the addition-curable silicone resin composition of the invention is preferably such that the total amount of hydrogen atoms bonded to silicon atoms within component B is from 0.5 to 3 moles per mole of alkenyl groups bonded to silicon atoms in components A-1 and A-2 combined. When the amount of component B is within a range of, in particular, from 0.8 to 2 moles, the addition curing reaction proceeds smoothly, which is preferable because a cured silicone product can easily be obtained from the addition-curable silicone resin composition. When the amount of component B falls outside the above range, the addition curing reaction proceeds with difficulty and the cured silicone product tends to change over time.

(C) Addition Reaction Catalyst

The addition reaction catalyst serving as component C is included to induce an addition curing reaction on the inventive composition to proceed. There are platinum-based catalysts, palladium-based catalysts and rhodium-based catalysts. From the standpoint of cost and other considerations, use is typically made of platinum-based catalysts such as platinum, platinum black and chloroplatinic acid, illustrative examples of which include $H_2PtCl_6 \cdot mH_2O$, $K_2PtCl_6$, $KHPtCl_6 \cdot mH_2O$, $K_2PtCl_4$, $K_2PtCl_4 \cdot mH_2O$ and $PtO_2 \cdot mH_2O$ (m being a positive integer), as well as complexes of these with hydrocarbons (e.g., olefins), alcohols or vinyl group-containing organopolysiloxanes. These may be used singly or two or more may be used in combination.

The amount of addition reaction catalyst included in the addition-curable silicone resin composition of the invention, expressed in weight units of metal atoms per 100 parts by weight of the combined amount of components A-1 and A-2, is preferably in the range of 0.1 to 1,000 ppm, and more preferably in the range of 0.5 to 200 ppm. When the amount of addition reaction catalyst included in the composition is lower than this range, the addition curing reaction may not proceed smoothly. On the other hand, when the amount is higher than this range, coloration of the silicone cured product tends to arise.

Other Ingredients

In addition to components A to C, the addition-curable silicone resin composition of the invention may optionally include also various known additives, insofar as doing so does not detract from the objects of the invention.

Tackifier

A tackifier may be optionally included in the addition-curable silicone resin composition of the invention in order to impart adhesion. Illustrative examples of the tackifier include vinyltrimethoxysilane, vinyltriethoxysilane, 2-(3,4-epoxycyclohexyl)ethyltrimethoxysilane,
3-glycidoxypropyltrimethoxysilane,
3-glycidoxypropylmethyldiethoxysilane,
3-glycidoxypropyltriethoxysilane,
3-methacryloxypropylmethyldiethoxysilane,
3-methacryloxypropyltriethoxysilane,
N-2-(aminoethyl)-3-aminopropylmethyldimethoxysilane,
N-2-(aminoethyl)-3-aminopropyltrimethoxysilane,
N-2-(aminoethyl)-3-aminopropyltriethoxysilane,
N-phenyl-3-amionopropyltrimethoxysilane,
3-mercaptopropyltrimethoxysilane, trimethoxysilane, tetramethoxysilane, and oligomers thereof. These tackifiers may be used singly or two or more may be used in admixture.

The tackifier is added in an amount, based on the combined weight of components A to C, of preferably from 0 to 10 wt %, and more preferably from 0 to 5 wt %. When a tackifier is used, the addition of at least 1 wt % or more is preferred.

Inorganic Filler

An inorganic filler may be included in the addition-curable silicone resin composition of the invention in order to increase the strength of the resulting cured product. Illustrative examples of inorganic reinforcing fillers include fumed silica and fumed titanium dioxide. From the standpoint of the transparency of the resulting cured product, the use of fumed silica is especially preferred.

When an inorganic filler is added, the amount of addition per 100 parts by weight of components A to C combined is preferably in the range of up to 50 parts by weight, and preferably from 1 to 30 parts by weight.

Cure Inhibitor

A cure inhibitor or curing regulator may be included in the addition-curable silicone resin composition of the invention for such purposes as to adjust the cure rate. Illustrative examples of cure inhibitors include compounds selected from the group consisting of organopolysiloxanes having a high vinyl group content (e.g., tetramethyltetravinylcyclotetrasiloxane, hexavinyldisiloxane), triallyl isocyanurate, alkyl maleates, acetylene alcohols, and silane-modified products and siloxane-modified products thereof, hydroperoxide, tetramethylethylenediamine, benzotriazole and mixtures thereof.

When a cure inhibitor is added, the amount of addition per 100 parts by weight of component A to C combined is generally from 0.001 to 1 part by weight, and preferably from 0.005 to 0.5 part by weight.

The addition-curable silicone resin composition of the invention is used by uniformly mixing together components A to C and also any of the above and other additives as may be needed. The composition may be used as a single liquid (1-part system) or as two liquids (2-part system). When used as a 1-part system, the storability can be improved by adding a small amount of the above-described cure inhibitor such as acetylene alcohol. When used as a 2-part system, component B and component C are each stored separately; at the time of use, curing can be carried out by mixing the two liquids together.

The addition-curable silicone resin composition of the invention, in the state prior to curing, has a content of low-molecular-weight siloxane having a degree of polymerization of up to 10 and at least one SiH group per molecule of preferably 1 wt % or less, more preferably 0.5 wt % or less, and even more preferably 0.2 wt % or less. When the SiH-containing low-molecular-weight siloxane content within the composition is at or below this level, the vaporization of SiH group-containing low-molecular-weight siloxane and consequent formation of deposits on the surroundings during the cure can be minimized. The content of SiH-containing low-molecular-weight siloxane may even be 0 wt %.

The addition-curable silicone resin composition of the invention can, according to the intended use, be applied onto a substrate and subsequently cured. The curing reaction proceeds even at normal temperature (25° C.). However, to shorten the curing time, heat curing in the temperature range of 60 to 200° C., and especially 100 to 170° C., is preferred. At a heating temperature lower than this range, a long period of treatment is required to effect a full cure, which is undesirable in terms of cost. On the other hand, at a heating temperature higher than this range, bubbling and resin deterioration may occur, both of which are undesirable. The heat curing time may be set to from 1 to 4 hours.

The cured silicone product obtained from the addition-curable silicone resin composition of the invention has a hardness, measured using a type D durometer as set forth in JIS K 6253-3: 2012, of preferably at least 40 and not more than 85, and more preferably at least 50 and not more than 75. At a hardness within this range, when the cured silicone product is used as a die attach material for optical semiconductor devices, LED chips can be fully attached onto a substrate, enabling the wire bonding step to be smoothly carried out.

By using the specific organohydrogenpolysiloxane described above, the addition-curable silicone resin composition of the invention is able to minimize contaminant deposition during the cure and thus can be used in electrical and electronic component applications. Specifically, the inventive composition can be advantageously used as a die attach material for optical semiconductor devices with minimal contamination of the gold electrode pads on LED chips during cure, making it possible to smoothly carry out the wire bonding step.

EXAMPLES

Synthesis Examples, Working Examples and Comparative Examples are given below by way of illustration and not by way of limitation. In the following Examples, parts are by weight. Also, "Me" stands for a methyl group and "Vi" stands for a vinyl group.

In the Examples, the content of low-molecular-weight siloxane having a degree of polymerization of up to 10 and at least one SiH group per molecule was determined by gas chromatography using a flame ionization detector (FID) and a GC-2014 gas chromatograph (Shimadzu Corporation). The samples were prepared by dissolving 1.0 g of the specimen in an n-tetradecane/acetone standard solution (concentration, 20 µg/mL). The viscosities at 25° C. shown in the Synthesis Examples were measured with a rotary viscometer by the method described in JIS K 7117-1: 1999.

Synthesis Example 1

Organohydrogenpolysiloxane (b-1)

An aqueous hydrochloric acid solution was added dropwise to an isopropyl alcohol solution containing 4.8 mol of the organodisiloxane $(HMe_2Si)_2O$ and 3 mol of methyl polysilicate (M Silicate 51, from Tama Chemicals Co., Ltd.; monomer content, ≤4.3 wt %), and stirred 5 hours at room temperature (25° C.). Toluene was added to dilute the mixture, the waste acid was separated off, and the organic phase was rinsed to neutrality with water. The organic phase was then dehydrated, after which the solvent was distilled off by a stripping operation at 150° C. and reduced pressure, giving Organohydrogenpolysiloxane (b-1) as a clear, colorless semisolid substance having a viscosity at 25° C. of 5,900 Pa·s. The siloxane units making up the resulting (b-1) consisted of 44 mol % of $HMe_2SiO_{1/2}$ units and 56 mol % of $SiO_{4/2}$ units. The weight-average molecular weight Mw obtained by GPC measurement was 4,800 and the SiH group content was 0.66 mol/100 g. The content in (b-1) of low-molecular-weight siloxane having a degree of polymerization of up to 10 and at least one SiH group per molecule was measured and found to be 0.16 wt %. This (b-1) was used directly in an addition-curable silicone resin composition without further low-molecular-weight siloxane removal operations beyond that mentioned above.

Synthesis Example 2

Organohydrogenpolysiloxane (b-2)

An aqueous hydrochloric acid solution was added dropwise to an isopropyl alcohol solution containing 6 mol of the organodisiloxane $(HMe_2Si)_2O$ and 3 mol of methyl polysilicate (M Silicate 51, from Tama Chemicals Co., Ltd.; monomer content, ≤4.3 wt %), and stirred 5 hours at room temperature (25° C.). Toluene was added to dilute the mixture, the waste acid was separated off, and the organic phase was rinsed to neutrality with water. The organic phase was then dehydrated, after which the solvent was distilled off by a stripping operation at 150° C. and reduced pressure, giving Organohydrogenpolysiloxane (b-2) as a clear, colorless semisolid substance having a viscosity at 25° C. of 1,200 Pa·s. The siloxane units making up the resulting (b-2) consisted of 50 mol % of $HMe_2SiO_{1/2}$ units and 50 mol % of $SiO_{4/2}$ units. The weight-average molecular weight Mw obtained by GPC measurement was 3,700 and the SiH group content was 0.70 mol/100 g. The content in (b-2) of low-molecular-weight siloxane having a degree of polymerization of up to 10 and at least one SiH group per molecule was measured and found to be 0.39 wt %. This (b-2) was used directly in an addition-curable silicone resin composition without further low-molecular-weight siloxane removal operations beyond that mentioned above.

Synthesis Example 3

Organohydrogenpolysiloxane (b-3)

An aqueous hydrochloric acid solution was added dropwise to an isopropyl alcohol solution containing 3 mol of the organodisiloxane $(HMe_2Si)_2O$, 3 mol of the organodisiloxane $(Me_3Si)_2O$ and 3 mol of methyl polysilicate (M Silicate 51, from Tama Chemicals Co., Ltd.; monomer content, ≤4.3 wt %), and stirred 5 hours at room temperature (25° C.). Toluene was added to dilute the mixture, the waste acid was separated off, and the organic phase was rinsed to neutrality with water. The organic phase was then dehydrated, after which the solvent was distilled off by a stripping operation at 150° C. and reduced pressure, giving Organohydrogenpolysiloxane (b-3) as a clear, colorless semisolid substance having a viscosity at 25° C. of 320 Pa·s. The siloxane units making up the resulting (b-3) consisted of 25 mol % of $HMe_2SiO_{1/2}$ units, 25 mol % of $Me_3SiO_{1/2}$ units and 50 mol % of $SiO_{4/2}$ units. The weight-average molecular weight Mw obtained by GPC measurement was 2,600 and the SiH group content was 0.40 mol/100 g. The content in (b-3) of low-molecular-weight siloxane having a degree of polymerization of up to 10 and at least one SiH group per molecule was measured and found to be 0.35 wt %. This (b-3) was used directly in an addition-curable silicone resin composition without further low-molecular-weight siloxane removal operations beyond that mentioned above.

Synthesis Example 4

Organohydrogenpolysiloxane (b-4)

An aqueous hydrochloric acid solution was added dropwise to an isopropyl alcohol solution containing 12 mol of the organodisiloxane $(HMe_2Si)_2O$ and 3 mol of methyl polysilicate (M Silicate 51, from Tama Chemicals Co., Ltd.; monomer content, ≤4.3 wt %), and stirred 5 hours at room temperature (25° C.). Toluene was added to dilute the mixture, the waste acid was separated off, and the organic phase was rinsed to neutrality with water. The organic phase was then dehydrated, after which the solvent was distilled off by a stripping operation at 150° C. and reduced pressure, giving Organohydrogenpolysiloxane (b-4) as a clear, colorless liquid substance having a viscosity at 25° C. of 2.6 Pa·s. The siloxane units making up the resulting (b-4) consisted of 66 mol % of $HMe_2SiO_{1/2}$ units and 34 mol % of $SiO_{4/2}$ units. The weight-average molecular weight Mw obtained by GPC measurement was 1,300 and the SiH group content was 1.00 mol/100 g. The content in (b-4) of low-molecular-weight siloxane having a degree of polymerization of up to 10 and at least one SiH group per molecule was measured and found to be 5.5 wt %. This (b-4) was used directly in an addition-curable silicone resin composition without further low-molecular-weight siloxane removal operations beyond that mentioned above.

Synthesis Example 5

Organohydrogenpolysiloxane (b-5)

An aqueous hydrochloric acid solution was added dropwise to an isopropyl alcohol solution containing 6 mol of the organodisiloxane $(HMe_2Si)_2O$ and 12 mol of the tetraalkoxysilane $(MeO)_4Si$, and stirred 5 hours at room temperature (25° C.). Toluene was added to dilute the mixture, the waste acid was separated off, and the organic phase was rinsed to neutrality with water. The organic phase was then dehydrated, after which the solvent was distilled off by a stripping operation at 150° C. and reduced pressure, giving Organohydrogenpolysiloxane (b-5) as a clear, colorless semisolid substance having a viscosity at 25° C. of 280 Pa·s. The siloxane units making up the resulting (b-5) consisted of 50 mol % of $HMe_2SiO_{1/2}$ units and 50 mol % of $SiO_{4/2}$ units. The weight-average molecular weight Mw obtained by GPC measurement was 3,100 and the SiH group content was 0.73 mol/100 g. The content in (b-5) of low-molecular-weight siloxane having a degree of polymerization of up to 10 and at least one SiH group per molecule was measured and found to be 28.4 wt %. This (b-5) was used directly in an addition-curable silicone resin composition without further low-molecular-weight siloxane removal operations beyond that mentioned above.

Synthesis Example 6

Organohydrogenpolysiloxane (b-6)

An aqueous hydrochloric acid solution was added dropwise to an isopropyl alcohol solution containing 2.4 mol of the organodisiloxane (Me$_3$Si)$_2$O, 9.6 mol of the organosilane HMeSi(OMe)$_2$ and 2.4 mol of methyl polysilicate (M Silicate 51, from Tama Chemicals Co., Ltd.; monomer content, ≤4.3 wt %), and stirred 5 hours at room temperature (25° C.). Toluene was added to dilute the mixture, the waste acid was separated off, and the organic phase was rinsed to neutrality with water. The organic phase was then dehydrated, after which the solvent was distilled off by a stripping operation at 150° C. and reduced pressure, giving Organohydrogenpolysiloxane (b-6) as a clear, colorless semisolid substance having a viscosity at 25° C. of 450 Pa·s. The siloxane units making up the resulting (b-6) consisted of 20 mol % of Me$_3$SiO$_{1/2}$ units, 40 mol % of HMeSiO$_{2/2}$ units and 40 mol % of SiO$_{4/2}$ units. The weight-average molecular weight Mw obtained by GPC measurement was 3,300 and the SiH group content was 0.60 mol/100 g. The content in (b-6) of low-molecular-weight siloxane having a degree of polymerization of up to 10 and at least one SiH group per molecule was measured and found to be 21.5 wt %. This (b-6) was used directly in an addition-curable silicone resin composition without further low-molecular-weight siloxane removal operations beyond that mentioned above.

Working Example 1

An addition-curable silicone resin composition was prepared by adding together 50 parts of (A-1) a linear polyorganosiloxane of formula (i) below

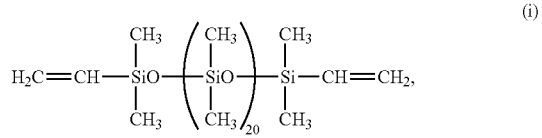

50 parts of (A-2) a branched organopolysiloxane consisting of 60 mol % of SiO$_{4/2}$ units, 34 mol % of (CH$_3$)$_3$SiO$_{1/2}$ units and 6 mol % of Vi$_3$SiO$_{1/2}$ units, (B) the organohydrogenpolysiloxane (b-1) prepared in Synthesis Example 1, in an amount corresponding to 1.5 moles per mole of the combined amount of vinyl groups in components A-1 and A-2, and 0.05 part of (C) an octyl alcohol-modified solution of chloroplatinic acid (platinum content, 2 wt %), and then thoroughly stirring. The content in this composition of low-molecular-weight siloxane having a degree of polymerization of up to 10 and at least one SiH group per molecule was measured and found to be 0.04 wt %. This composition was molded under heating at 150° C. for 4 hours, thereby producing a cured silicone product.

Working Example 2

Aside from changing the 50 parts of component A-2 used in Working Example 1 to 50 parts of a branched organopolysiloxane consisting of 60 mol % of SiO$_{4/2}$ units, 25 mol % of (CH$_3$)$_3$SiO$_{1/2}$ units and 15 mol % of Vi$_3$SiO$_{1/2}$ units, an addition-curable silicone resin composition was prepared in the same way as in Working Example 1. The content in this composition of low-molecular-weight siloxane having a degree of polymerization of up to 10 and at least one SiH group per molecule was measured and found to be 0.07 wt %. This composition was molded under heating at 150° C. for 4 hours, thereby producing a cured silicone product.

Working Example 3

Aside from changing component B used in Working Example 1 from (b-1) to the organohydrogenpolysiloxane (b-2) prepared in Synthesis Example 2, an addition-curable silicone resin composition was prepared in the same way as in Working Example 1. The content in this composition of low-molecular-weight siloxane having a degree of polymerization of up to 10 and at least one SiH group per molecule was measured and found to be 0.10 wt %. This composition was molded under heating at 150° C. for 4 hours, thereby producing a cured silicone product.

Working Example 4

Aside from changing component B used in Working Example 1 from (b-1) to the organohydrogenpolysiloxane (b-3) prepared in Synthesis Example 3, an addition-curable silicone resin composition was prepared in the same way as in Working Example 1. The content in this composition of low-molecular-weight siloxane having a degree of polymerization of up to 10 and at least one SiH group per molecule was measured and found to be 0.13 wt %. This composition was molded under heating at 150° C. for 4 hours, thereby producing a cured silicone product.

Comparative Example 1

Aside from changing component B used in Working Example 1 from (b-1) to the organohydrogenpolysiloxane (b-4) prepared in Synthesis Example 4, an addition-curable silicone resin composition was prepared in the same way as in Working Example 1. The content in this composition of low-molecular-weight siloxane having a degree of polymerization of up to 10 and at least one SiH group per molecule was measured and found to be 1.20 wt %. This composition was molded under heating at 150° C. for 4 hours, thereby producing a cured silicone product.

Comparative Example 2

Aside from changing the 50 parts of component A-2 used in Comparative Example 1 to 50 parts of a branched organopolysiloxane consisting of 60 mol % of SiO$_{4/2}$ units, 23 mol % of (CH$_3$)$_3$SiO$_{1/2}$ units and 17 mol % of ViMeSiO$_{4/2}$ units, an addition-curable silicone resin composition was prepared in the same way as in Comparative Example 1. The content in this composition of low-molecular-weight siloxane having a degree of polymerization of up to 10 and at least one SiH group per molecule was measured and found to be 1.14 wt %. This composition was molded under heating at 150° C. for 4 hours, thereby producing a cured silicone product.

Comparative Example 3

Aside from changing component B used in Working Example 1 from (b-1) to the organohydrogenpolysiloxane (b-5) prepared in Synthesis Example 5, an addition-curable silicone resin composition was prepared in the same way as in Working Example 1. The content in this composition of low-molecular-weight siloxane having a degree of polymerization of up to 10 and at least one SiH group per molecule was measured and found to be 7.63 wt %. This composition was molded under heating at 150° C. for 4 hours, thereby producing a cured silicone product.

Comparative Example 4

Aside from changing component B used in Working Example 1 from (b-1) to the organohydrogenpolysiloxane (b-6) prepared in Synthesis Example 6, an addition-curable silicone resin composition was prepared in the same way as in Working Example 1. The content in this composition of low-molecular-weight siloxane having a degree of polymerization of up to 10 and at least one SiH group per molecule was measured and found to be 6.44 wt %. This composition was molded under heating at 150° C. for 4 hours, thereby producing a cured silicone product.

Using the addition-curable silicone resin compositions prepared in the Working Examples and Comparative Examples, the hardness, level of contamination during cure and wire bondability were evaluated using the following test methods. The results are shown below in Table 1 (Working Examples) and Table 2 (Comparative Examples).

(a) Hardness

A cured silicone product was produced by using a circulating hot-air dryer to heat the addition-curable silicone resin composition at 150° C. for 4 hours. The hardness of the resulting cured silicone product was measured using a type D durometer in accordance with JIS K 6253-3: 2012.

(b) Level of Contamination During Cure

The level of contamination during cure of an addition-curable silicone resin composition was evaluated by the following method using a gold-plated substrate.

The addition-curable silicone resin composition (1.0 g) was placed, together with a substrate that had been electroplated with gold (surface area, 2 cm$^2$), in a sealed aluminum vessel having a capacity of 30 cm$^3$ in such a way that the silicone resin and the gold-plated substrate are not in contact, and the system was heated at 150° C. for 4 hours using a circulating hot-air dryer. After heating, the system was cooled to 25° C. with the vessel remaining in a sealed state. The gold-plated substrate was then removed from the vessel, following which the surface of the substrate was examined with the unaided eye to determine the extent of contaminant deposition.

The level of contamination during cure by each of the addition-curable silicone resin compositions was rated as follows, based on the percentage of the total surface area of the gold-plated substrate over which contaminants had deposited:

Good: Less than 5%
Acceptable: At least 5% and less than 25%
NG: 25% or more (c) Wire Bondability The wire bondability of an addition-curable silicone resin composition was evaluated as follows.

The addition-curable silicone resin composition was applied by stamping to the center of each cavity on a leadframe (surface area, 5 cm$^2$) which was equipped with a white reflector member made of epoxy resin and had a surface formed by silver plating, following which 50 LED chips (each with a surface area of 600 μm$^2$) having both p and n electrodes formed by gold plating over a 90 μm$^2$ surface area were arranged thereon. The leadframe was encapsulated and sealed in a sealable aluminum pouch having a surface area of 6 cm$^2$ and then heated at 150° C. for 4 hours using a circulating hot-air dryer, after which the dryer was cooled to normal temperature (25° C.) with the pouch remaining in a sealed state and the leadframe was removed from the pouch. Next, the electrodes on the LED chips were bonded to the leadframe surface with a wire bonder (UTC-1000 super, from Shinkawa, Ltd.) using 30 μm diameter gold wire. Measurement of the ball shear strength at the first ball bond on the LED chip electrodes (total number of p and n electrodes, 100) was carried out with a Dage 4000 Bondtester (Nordson Dage) by the method described in JESD22-B116.

The wire bondability was evaluated, for a total of 100 electrodes on which the wire bonding operation was attempted, based on the number of electrodes where the first ball bond could not be formed and wire bonding did not occur (number of times wire bonding failed) and, when the first ball bond could be formed and ball shear strength measurement was carried out, on the average ball shear strength for all first ball bonds. The ball shear strength was evaluated by setting the average ball shear strength using a heat-curable epoxy resin silver paste (X-43-5603-7AQ, from Shin-Etsu Chemical Co., Ltd.) to 100% and calculating the percentage of this to which the average ball shear strength obtained when using the respective addition-curable silicone resin compositions in the Working Examples and Comparative Examples corresponds.

TABLE 1

| | Working Example | | | |
| --- | --- | --- | --- | --- |
| | 1 | 2 | 3 | 4 |
| SiH/SiVi | 1.5 | 1.5 | 1.5 | 1.5 |
| Appearance | clear, colorless | clear, colorless | clear, colorless | clear, colorless |
| Curing conditions | 150° C./ 4 hours | 150° C./ 4 hours | 150° C./ 4 hours | 150° C./ 4 hours |
| Hardness (type D) | 64 | 68 | 65 | 63 |
| Contamination during cure | good | good | good | good |
| Number of times wire bonding failed | 0/100 | 0/100 | 0/100 | 0/100 |
| Ball shear strength (%) | 98 | 96 | 97 | 98 |

TABLE 2

| | Comparative Example | | | |
| --- | --- | --- | --- | --- |
| | 1 | 2 | 3 | 4 |
| SiH/SiVi | 1.5 | 1.5 | 1.5 | 1.5 |
| Appearance | clear, colorless | clear, colorless | clear, colorless | clear, colorless |
| Curing conditions | 150° C./ 4 hours | 150° C./ 4 hours | 150° C./ 4 hours | 150° C./ 4 hours |
| Hardness (type A) | 65 | 55 | 67 | 64 |
| Contamination during cure | acceptable | acceptable | NG | NG |
| Number of times wire bonding failed | 6/100 | 9/100 | 15/100 | 24/100 |
| Ball shear strength (%) | 81 | 74 | 65 | 58 |

As shown in Table 1, the addition-curable silicone resin compositions of Working Examples 1 to 4 yielded cured products having a high hardness, in addition to which contamination to the surroundings during the cure was low and the wire bondability was good.

By contrast, as shown in Table 2, the addition-curable silicone resin compositions of Comparative Examples 1 to 4 all were contaminating during the cure and the wire bondability was poor.

With regard to Comparative Examples 1 and 2, in component B, the amount of M units and the content of SiH group-containing low-molecular-weight siloxane were both higher than specified in this invention. Moreover, these differ from Working Example 1 in that they use an organohydrogenpolysiloxane having a small weight-average molecular weight Mw. Comparative Example 2 also differs from Working Example 1 in that it uses as component A-2 a branched organopolysiloxane having vinyl groups on D units, which have a poor reactivity, rather than on M units. Comparative Example 3 uses a tetraalkoxysilane rather than a polysilicate as a component B source, and thus differs from Working Example 1 in that the resulting component B has a high content of SiH group-containing low-molecular-weight siloxane. As for Comparative Example 4, in component B, hydrogen atoms are present not on M units but rather on D units, and so this Example differs from Working Example 1 in that it uses an organohydrogenpolysiloxane having a higher content of SiH group-containing low-molecular-weight siloxane than specified in the invention.

The above tests and evaluations showed that the addition-curable silicone resin compositions of the invention, by making use of the specific organohydrogenpolysiloxanes described above, minimize contamination of the gold electrode pads on LED chips and confer good wire bondability when employed as die attach materials for optical semiconductor devices. These results confirmed the addition-curable silicone resin compositions of the invention to be exceedingly useful as die attach materials for optical semiconductor devices.

Japanese Patent Application No. 2015-036108 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. An addition-curable silicone resin composition comprising:
   (A-1) a linear organopolysiloxane having at least two alkenyl groups per molecule;
   (A-2) a branched organopolysiloxane of the average compositional formula (1) below which has at least two alkenyl groups per molecule $$R^1{}_{3-t}R^2{}_tSiO_{1/2})_p(R^3{}_2SiO_{2/2})_q(R^3SiO_{3/2})_r(SiO_{4/2})_s \quad (1)$$

wherein $R^1$ is independently an alkenyl group of 2 to 8 carbon atoms, $R^2$ is independently a substituted or unsubstituted monovalent hydrocarbon group of 1 to 12 carbon atoms which contains no aliphatic unsaturated bonds, each $R^3$ is independently $R^1$ or $R^2$, with at least two of the $R^3$ groups on the molecule being $R^1$, p, q, r and s satisfy the conditions $0.01 \leq p \leq 0.6$, $0 \leq q$, $0 \leq r$ and $0.1 \leq s \leq 0.9$, with the proviso that $p+q+r+s=1$, and t satisfies the condition $0 \leq t < 3$;
   (B) an organohydrogenpolysiloxane of the average compositional formula (2) below which has a content of low-molecular-weight siloxane having a degree of polymerization of up to 10 and at least one SiH group per molecule of 5 wt % or less $$R^4{}_3SiO_{1/2})_a(R^5{}_2SiO_{2/2})_b(R^5SiO_{3/2})_c(SiO_{4/2})_d \quad (2)$$

wherein each $R^4$ is independently a hydrogen atom or a methyl group, with at least two of all the $R^4$ groups being hydrogen atoms, each $R^5$ is independently a substituted or unsubstituted monovalent hydrocarbon group of 1 to 12 carbon atoms which contains no aliphatic unsaturated bonds, and a, b, c and d satisfy the conditions $0.01 \leq a \leq 0.6$, $0 \leq b$, $0 \leq c$ and $0.1 \leq d \leq 0.9$, with the proviso that $a+b+c+d=1$, wherein said organohydrogenpolysiloxane has a viscosity at 25° C., as measured by the method described in JIS K 7117-1:1999, of at least 10 Pa·s; and
   (C) an addition reaction catalyst.

2. The composition of claim 1, wherein the content of low-molecular-weight siloxane having a degree of polymerization of up to 10 and at least one SiH group per molecule is 1 wt % or less.

3. The composition of claim 1, wherein the organohydrogenpolysiloxane (B) has a weight-average molecular weight of at least 1,500 and up to 6,000.

4. The composition of claim 1, wherein component B is an organohydrogenpolysiloxane of the average compositional formula (3) below $$(R^4{}_3SiO_{1/2})_e(SiO_{4/2})_f \quad (3)$$

wherein each $R^4$ is independently a hydrogen atom or a methyl group, with at least two of all the $R^4$ groups being hydrogen atoms, and e and f satisfy the conditions $0.01 \leq e \leq 0.6$ and $0.4 \leq f \leq 0.99$, with the proviso that $e+f=1$.

5. The composition of claim 1, wherein the source of the $SiO_{4/2}$ units in the organohydrogenpolysiloxane (B) is tetramethoxysilane or a partial hydrolyzate/condensate of tetraethoxysilane or both.

6. The composition of claim 1, wherein component A-1 is a linear organopolysiloxane having alkenyl groups only at both ends and component A-2 is a branched organopolysiloxane having, in formula (1), alkenyl groups only on the $R^1{}_{3-t}R^2{}_tSiO_{1/2}$ units.

7. The composition of claim 1, wherein component A-2 is a branched organopolysiloxane of the average compositional formula (4) below $$R^6{}_3SiO_{1/2})_u(R^7{}_3SiO_{1/2})_v(SiO_{4/2})_w \quad (4)$$

wherein $R^6$ is a vinyl group, $R^7$ is a methyl group, and u, v and w satisfy the conditions $0.01 \leq u+v \leq 0.6$ and $0.4 \leq w \leq 0.99$, with the proviso that $u+v+w=1$, and has at least two alkenyl groups per molecule.

8. A die attach material for an optical semiconductor device, comprising the addition-curable silicone resin composition of claim 1.

* * * * *